United States Patent
Hsieh et al.

(10) Patent No.: US 9,299,592 B2
(45) Date of Patent: Mar. 29, 2016

(54) PACKAGE STRUCTURE AND PACKAGING METHOD OF WAFER LEVEL CHIP SCALE PACKAGE

(71) Applicants: Chih-Cheng Hsieh, New Taipei (TW); Hsiu-Wen Hsu, Hsinchu County (TW); Chun-Ying Yeh, Hsinchu (TW); Chung-Ming Leng, New Taipei (TW)

(72) Inventors: Chih-Cheng Hsieh, New Taipei (TW); Hsiu-Wen Hsu, Hsinchu County (TW); Chun-Ying Yeh, Hsinchu (TW); Chung-Ming Leng, New Taipei (TW)

(73) Assignees: NIKO SEMICONDUCTOR CO., LTD., New Taipei (TW); Super Group Semiconductor Co. LTD., New Taipei (TW)

( * ) Notice: Subject to any disclaimer, the term of this patent is extended or adjusted under 35 U.S.C. 154(b) by 0 days.

(21) Appl. No.: 14/574,405

(22) Filed: Dec. 18, 2014

(65) Prior Publication Data
US 2015/0262843 A1    Sep. 17, 2015

(30) Foreign Application Priority Data
Mar. 14, 2014   (TW) .............................. 103109545 A

(51) Int. Cl.
| | |
|---|---|
| *H01L 23/495* | (2006.01) |
| *H01L 21/56* | (2006.01) |
| *H01L 21/683* | (2006.01) |
| *H01L 23/31* | (2006.01) |
| *H01L 23/492* | (2006.01) |
| *H01L 23/00* | (2006.01) |
| *H01L 23/538* | (2006.01) |

(52) U.S. Cl.
CPC ............ *H01L 21/56* (2013.01); *H01L 21/6835* (2013.01); *H01L 23/3114* (2013.01); *H01L 23/4924* (2013.01); *H01L 24/27* (2013.01); *H01L 24/32* (2013.01); *H01L 24/83* (2013.01); *H01L 23/5389* (2013.01); *H01L 2221/68363* (2013.01); *H01L 2221/68372* (2013.01); *H01L 2221/68381* (2013.01); *H01L 2224/2732* (2013.01); *H01L 2224/29023* (2013.01); *H01L 2224/32245* (2013.01); *H01L 2224/83851* (2013.01); *H01L 2924/1203* (2013.01); *H01L 2924/1305* (2013.01); *H01L 2924/13055* (2013.01); *H01L 2924/13091* (2013.01)

(58) Field of Classification Search
CPC ............ H01L 51/5012; H01L 51/0072; H01L 51/0067; H01L 51/5072; H01L 51/5206
USPC .................. 438/114, 118, 107; 257/676, 687
See application file for complete search history.

(56) References Cited

U.S. PATENT DOCUMENTS

| | | | |
|---|---|---|---|
| 6,521,485 B2 * | 2/2003 | Su et al. ........................ | 438/114 |
| 7,122,887 B2 | 10/2006 | Standing et al. | |
| 7,321,164 B2 * | 1/2008 | Hsu ............................... | 257/686 |
| 7,476,979 B2 | 1/2009 | Standing et al. | |
| 7,939,377 B1 * | 5/2011 | Katagiri et al. ............... | 438/121 |
| 8,338,936 B2 * | 12/2012 | Pressel et al. ................. | 257/691 |
| 2013/0119538 A1 * | 5/2013 | McCarthy ..................... | 257/738 |

* cited by examiner

*Primary Examiner* — Andy Huynh
(74) *Attorney, Agent, or Firm* — Jianq Chyun IP Office

(57) ABSTRACT

A package structure and a packaging method of wafer level chip scale package are provided. The packaging method includes: providing a carrier, and disposing a plurality of chips on the carrier; forming a plurality of adhesive layers on a surface of the corresponding chips; covering a conductive cover plate, bonding the conductive cover plate with the chips through the adhesive layers, and dividing out a plurality of packaging spaces by the conductive cover plate for disposing the chips respectively; and providing an insulation material to fill the packaging spaces through via holes on the conductive cover plate to form a first insulation structure; finally, removing the carrier.

9 Claims, 11 Drawing Sheets

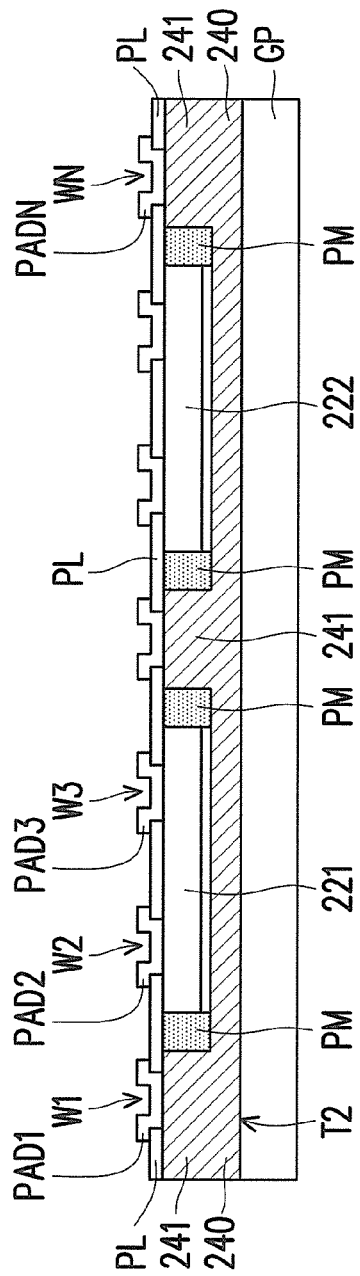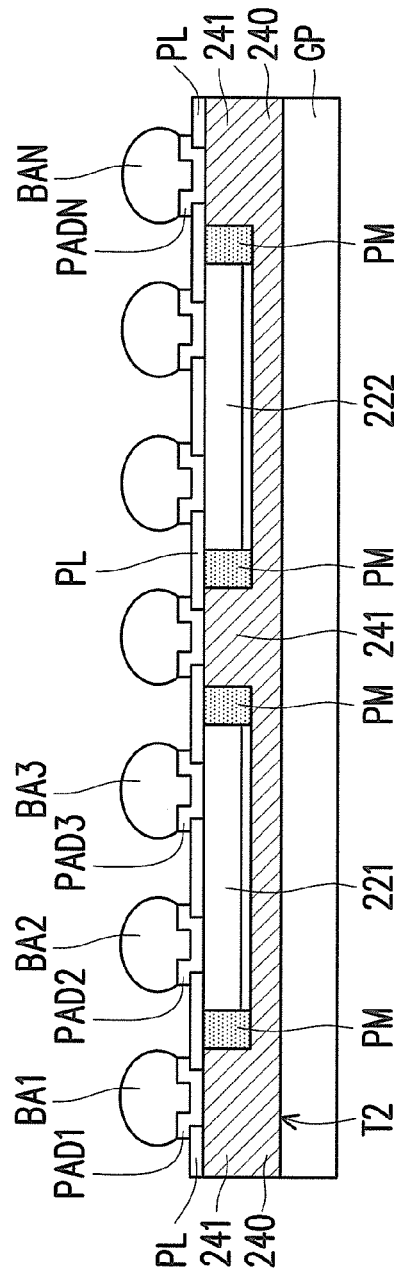

PACKAGE STRUCTURE AND PACKAGING METHOD OF WAFER LEVEL CHIP SCALE PACKAGE

CROSS-REFERENCE TO RELATED APPLICATION

This application claims the priority benefit of Taiwan application serial no. 103109545, filed on Mar. 14, 2014. The entirety of the above-mentioned patent application is hereby incorporated by reference herein and made a part of this specification.

BACKGROUND OF THE INVENTION

1. Field of the Invention

The invention relates to a package structure and a packaging method of a chip, and more particularly, relates to a package structure and a packaging method of wafer level chip scale package.

2. Description of Related Art

With electronic devices popularized in recent years, portable and wearable electronic devices have become important tools in daily lives. Accordingly, it becomes a necessary trend to develop electronic products and elements which include features such as high performance, compact volume, high computation speed, high quality and multifunction. In terms of appearance, a necessary trend thereof is to develop electronic products which are light, thin and compact. In order to meet the requirements of the trends, use of a packaging process of the wafer level chip scale package (WLCSP) becomes one of the necessary choices.

A major difference between the wafer level chip scale package and the traditional packing technology is that, a concept of wafer level chip scale package is to complete packaging of integrated circuits directly on the wafer instead of performing the packaging process for individual chip after being cut. By using the wafer level chip scale package, a dimension of a packaged chip is identical to a dimension of the original die. However, said dimension in the wafer level chip scale package will restrict a range for arranging fan-out. Accordingly, a packaging technology so-called wafer level chip scale package for fan-out has been proposed in the industry. By using the packaging technology of the wafer level chip scale package for fan-out, the packaged chip is capable of providing diverse and flexible wiring schemes, and making an adhesion between a chip and a printed circuit board easier to execute, so as to improve a production yield thereof.

SUMMARY OF THE INVENTION

The invention aims to provide a package structure of wafer level chip scale package having low packaging costs, thin product packing bodies, strengthen mechanical supporting capability and favorable heat dissipation effect. Further, a packaging method of afore said package structure is also provided.

A packaging method of wafer level chip scale package includes: providing a carrier, and disposing a plurality of chips on the carrier; forming a plurality of adhesive layers on a surface of the corresponding chips; covering a conductive cover plate, bonding the conductive cover plate with the chips through the adhesive layers, and dividing out a plurality of packaging spaces by the conductive cover plate for disposing the chips respectively; and providing an insulation material to fill the packaging spaces through via holes on the conductive cover plate to form a first insulation structure; finally, removing the carrier.

The invention further provides a package structure of wafer level chip scale package, including a conductive plate, a chip, a first insulation structure, a second insulation structure and a plurality of pads. The conductive plate has a carrying portion and at least one protruding portion, and the chip is adhered on the carrying portion through a plurality of adhesive layers. The first insulation structure surrounds a circumference of the chip on the carrying portion. The second insulation structure isolates a plurality of electrode windows, respectively. The pads are respectively disposed in the electrode windows to form a plurality of electrodes.

Based on above, in the packaging method of the invention, the insulation material completely covers the circumference of the chip by ways of suck-in (or fill-in), so as to improve a reliability of the packaged chip. Furthermore, by using the packaging method of wafer level chip scale package according to the invention, the packaged chip may be tested through a testing machine of wafer level chip scale package, so as to significantly reduce a complexity and packaging costs in production process.

To make the above features and advantages of the disclosure more comprehensible, several embodiments accompanied with drawings are described in detail as follows.

BRIEF DESCRIPTION OF THE DRAWINGS

FIG. 2A to FIG. 2K are schematic diagrams illustrating implementation details of the packaging method of wafer level chip scale according to embodiments of the invention.

DESCRIPTION OF THE EMBODIMENTS

Figure 1:
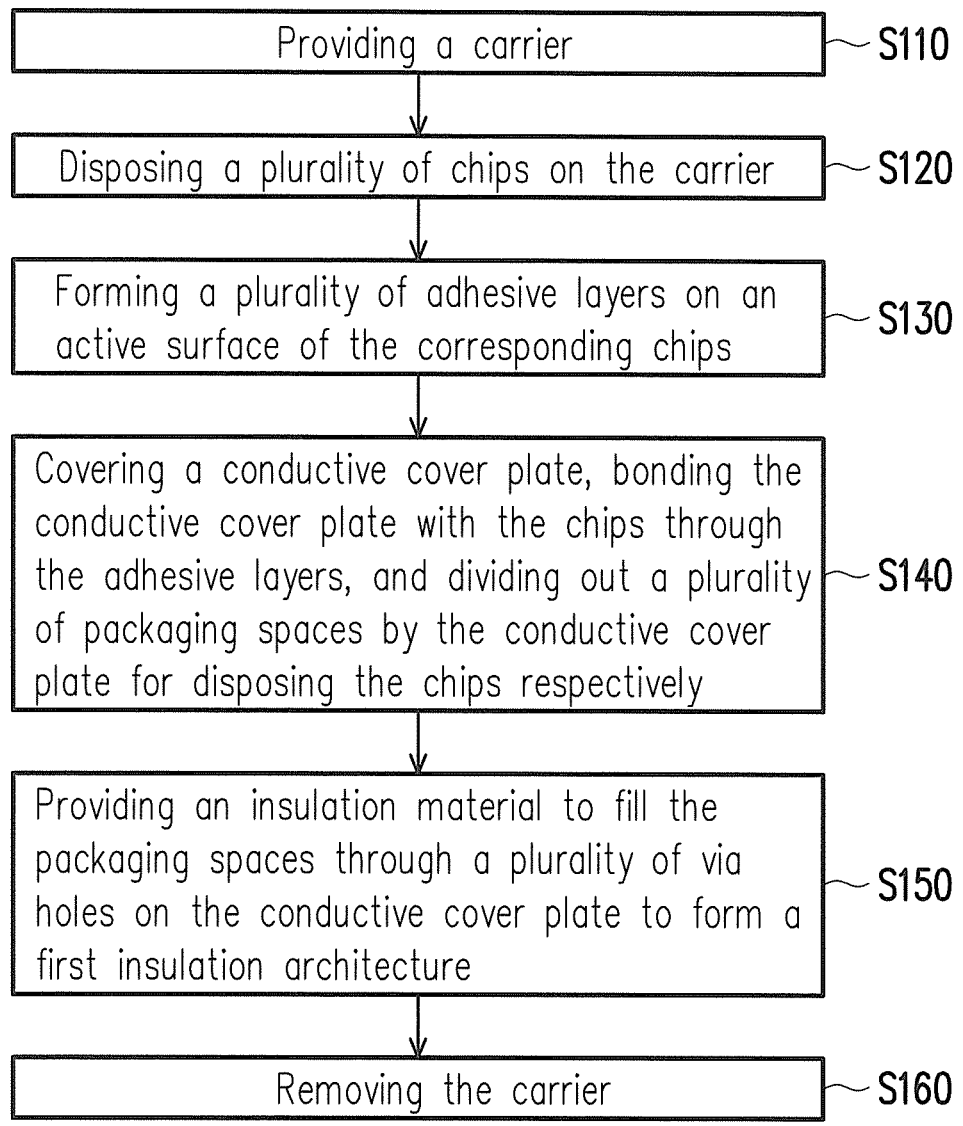
FIG. 1 is a flowchart illustrating a packaging method of wafer level chip scale according to an embodiment of the invention.
Figure 2A:
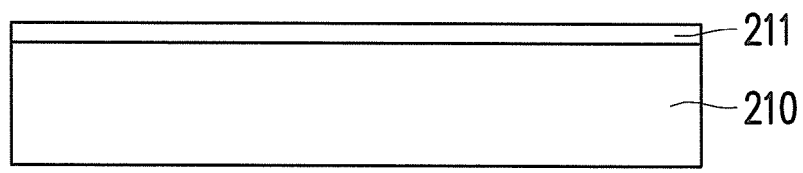

Referring to FIG. 1, an embodiment of a manufacturing process and a method of the invention is disclosed. FIG. 1 is a flowchart illustrating a packaging method of wafer level chip scale according to an embodiment of the invention. Referring also to FIG. 2A to FIG. 2K, which are schematic diagrams illustrating implementation details of the packaging method of wafer level chip scale according to embodiments of the invention. In FIG. 1 and FIG. 2A, in step S110, a carrier 210 is provided, and a surface of the carrier 210 is covered with a peel film tap 211. In the present embodiment, the carrier 210 may be a circular carrier having a dimension identical to that of a wafer, such as a circular piece in 6-inch, 8-inch or 12-inch. In regard to a material thereof, the carrier 210 may be manufactured by materials such as metal, metal alloy, plastic or quartz glass. The carrier 210 may be composed of conductive or insulation materials. The peel film tape 211 may be a tape that is adhesive at both sides.

Figure 2B:
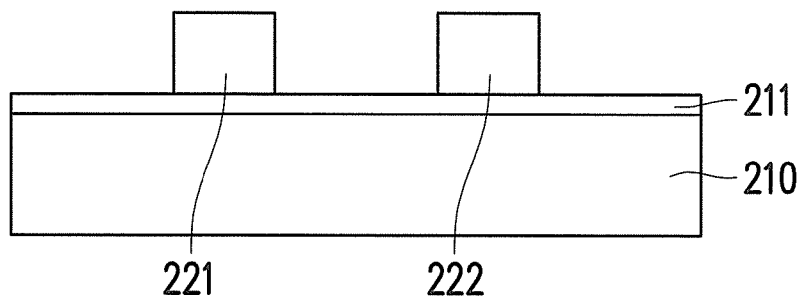
Figure 2C:
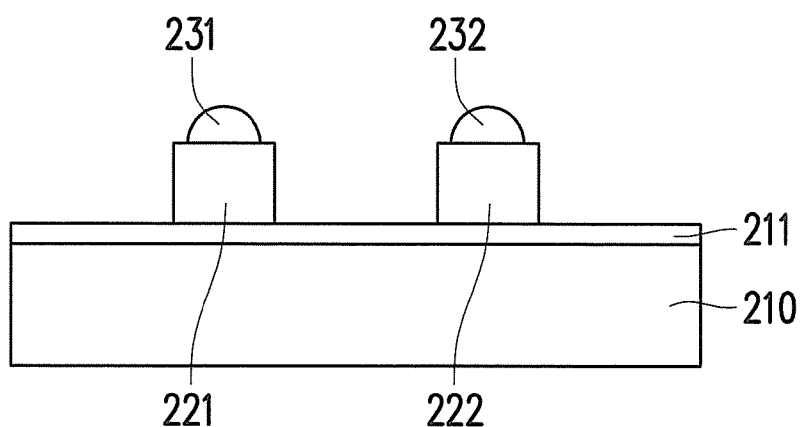
Figure 2D:
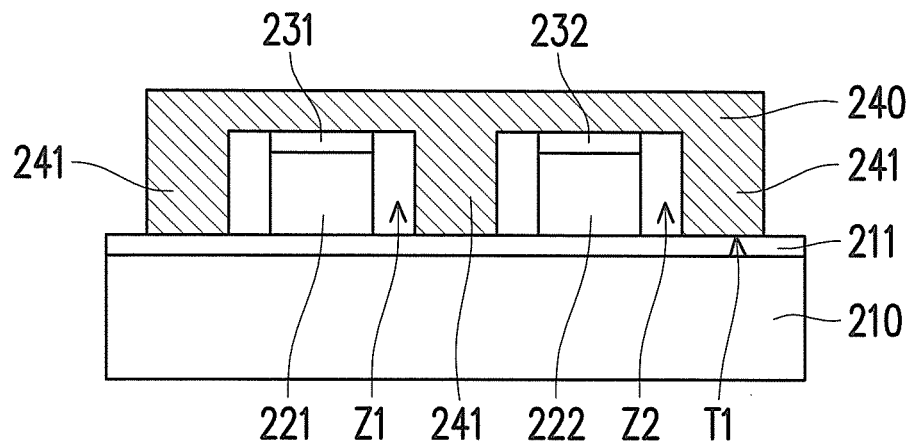

Next, in step S120, a plurality of chips cut from the wafer are disposed on the carrier 210. Hereinafter, a vertical metal-oxide-semiconductor field-effect transistor (MOSFET) is used as the chip for example. Naturally, the chip may also apply an insulated gate bipolar transistor (IGBT), a bipolar junction transistor (BJT), a diode and so on. A first active surface of the chip may be designed to include two electrodes (i.e., a source and a gate). A back surface of the chip (i.e., a second active surface) may be designed to include a drain. In FIG. 2B, chips 221 to 222 are disposed on the carrier 210, and the first active surface of the chips 221 to 222 are in contact with the peel film tape 211 tape for bonding to each other. In step S130, a plurality of adhesive layers (e.g., adhesive layers 231 and 232 depicted in FIG. 2C) are formed on the second active surface of the chips 221 to 222 on the corresponding carrier 210.

A forming method of the adhesive layers 231 and 232 includes placing, with the right amount of the adhesive layers 231 and 232 (which are conductive) on the second active surface of the chips 221 to 222 by ways of dispensing or screen-coating. The adhesive layers 231 and 232 may be conductive materials such as silver paste, tin paste or copper paste and so on.

In step S140, a conductive cover plate 240 covers above the chips 221 to 222 and the carrier 210. The conductive cover plate 240 may be electrically connected to the chips 221 to 222 through the adhesive layers 231 and 232, respectively. Further, a first side T1 of the conductive cover plate 240 includes a plurality of partition plates 241. The conductive cover plate 240 is capable of dividing out a plurality of packaging spaces Z1 and Z2 through the partition plates 241 and disposing the chips 221 to 222 in the packaging spaces Z1 and Z2 respectively. The conductive cover plate 240 as described above may be a circular metal frame, and formed by materials with electrical conduction properties such as copper, iron and nickel alloy. A shape and a dimension of the conductive cover plate 240 may be designed based on customer requirements, and manufactured by ways of etching or punching. The conductive cover plate 240 may be manufactured into the circular piece in 6-inch, 8-inch or 12-inch based on the dimension of the wafer in which the chips 221 and 222 are to be packaged, or may be manufactured into a rectangular shape. For instance, the conductive cover plate 240 may be manufactured by using a copper alloy piece with a thickness between 25 μm to 250 μm.

In addition, the partition plates 241 may be formed through an etching method, and a plane where the partition plates 241 are in contact with the peel film tape 211 may be coplanar with the second active surface of the chips 221 to 222. Forming positions and thicknesses of the partition plates 241 may be correspondingly adjusted according to positions where the chips 221 to 222 are disposed on the peel film tape 211. In the conductive cover plate 240, the partition plates 241 may form a mesh structure for dividing out the packaging spaces arranged in a plurality of arrays.

Figure 2E:
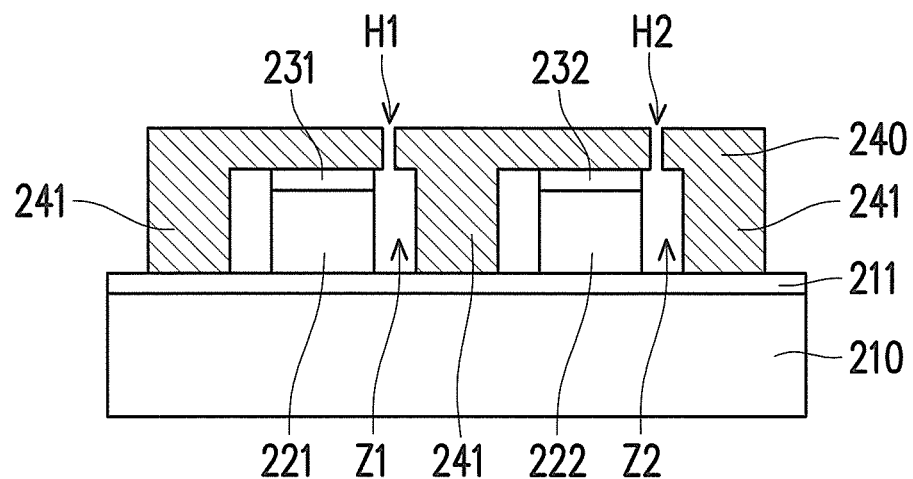
Figure 2F:
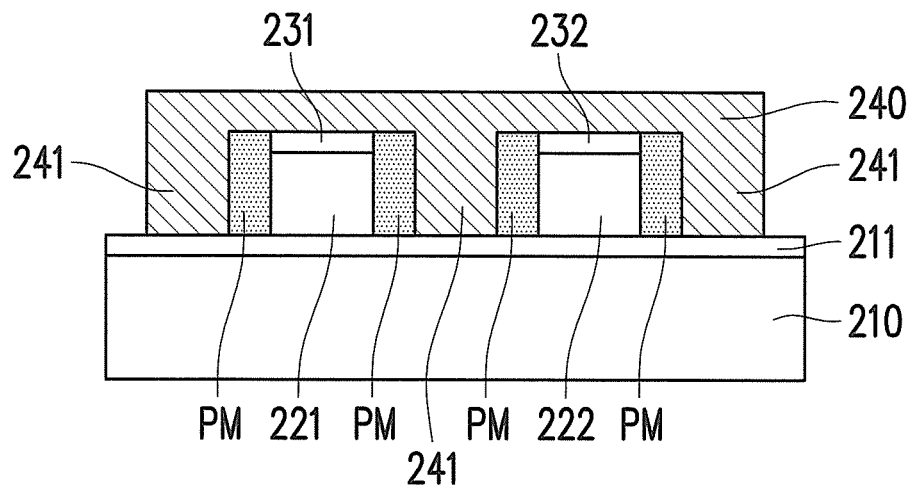

Accordingly, in step S150, an insulation material fills hollows left by the packaging spaces Z1 and Z2 through a plurality of paste-injection holes (or via holes), so as to form a first insulation structure. Referring to FIG. 1 and FIG. 2E together, the via holes H1 and H2 may be formed respectively at positions corresponding to the packaging spaces Z1 and Z2 on the conductive cover plate 240. Referring to FIG. 2F, an insulation material being liquid substance is provided to fill or to be sucked-in the packaging spaces Z1 an Z2 to form the first insulation structure through the via holes H1 and H2. In an embodiment, the insulation material being sucked-in fills the packaging spaces Z1 and Z2 to form the first insulation structure PM. In addition, after the packaging spaces Z1 and Z2 are filled with the insulation material, a curing action is performed on the first insulation structure PM.

The insulation material may be an insulation molding material, and may be any suitable thermoplastic or thermosetting materials such as resins including an epoxy group material, a silicon resin or a photoresistor and so on. The cured insulation material forms a plurality of molding bodies which are rigid structures for protecting the chips 221 to 222. In order to completely fill the packaging spaces Z1 and Z2 with the insulation material, in the embodiments of the invention, a vacuum process may be performed through the via holes H1 and H2 to create a vacuum condition for the packaging spaces Z1 and Z2. Thereafter, the liquid insulation material may be applied above the via holes H1 and H2, so that the liquid insulation material may be effectively sucked in the packaging spaces Z1 and Z2 to fill the packaging spaces Z1 and Z2. Accordingly, the molding bodies produced by the cured insulation material will not contain holes therein to cause structural weakness, so as to improve a reliability of the package.

Figure 2G:
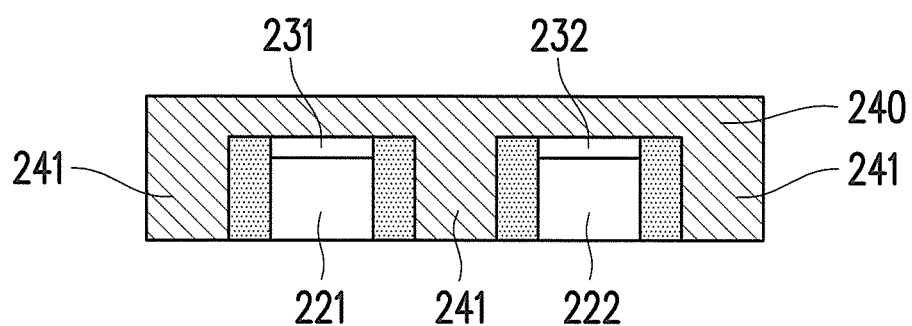

Next, in step S160, the carrier 210 is removed (as shown in FIG. 2G). Therein, removal of the carrier 210 may be achieved by removing the peel film tape 211. It should be noted that, as shown in FIG. 2G, the structure of a plastic packaging circular piece completed by afore-said method is smooth without warpage, overly-thick and overflow. Accordingly, steps of thinning or cleaning may be omitted to effectively reducing a complexity of the packaging method.

Subsequently, referring to FIG. 2H to FIG. 2J for parts regarding forming electrodes on the packaged chips. In FIG. 2H, the conductive cover plate 240 of the completed plastic packaging circular piece is combined with a glass substrate GP, so that the glass substrate GP is directly in contact with a second side T2 of the conductive cover plate 240.

Next, a polymer dielectric material is coasted on the first active surface of the chips 221 to 222 to form an insulation layer, and the insulation layer aims to increase strength of a passivation layer, so as to form a certain degree of insulation protection for the chips. Next, a plurality of electrode windows W1 to WN are formed on the insulation layer through a partial-etching method, wherein the electrode windows W1 to WN are served as contact windows for drains, sources and gates in the subsequent process, and the rest of the insulation layer are partially formed on surfaces at positions other than where the electrode windows W1 to WN are located, so that a second insulation structure PL may isolate the electrode windows W1 to WN respectively. The electrode windows W1 to WN are formed on a part of the first active surface of the chips 221 to 222 and a part of the partition plates 241, and the second insulation structure PL also covers on the part of the first active surface of the chips 221 to 222 and the part of the partition plates 241. The electrode windows W1 to WN are used to contact an exposed portion of the part of the first active surface of the chips 221 to 222 and an exposed portion of the partition plates 241. A plurality of pads PAD1 to PADN may be formed respectively on the exposed surfaces (i.e., in the electrode windows W1 to WN). The pads are known as Under-bump Metallurgy (UBM), which is served for connecting metals in subsequent straight ball or bump operation.

In FIG. 2I, a plurality of solder balls BA1 to BAN are formed on the pads PAD1 to PADN, respectively, and a plurality of electrodes are also formed. The solder ball BA1 may serve as a drain of a transistor in the chip 221, and the solder balls BA2 and BA3 may serve as a gate and a source of the transistor respectively. After related operations for ball placement are completed, the glass substrate GP is removed, as shown in FIG. 2J.

Figure 2J:
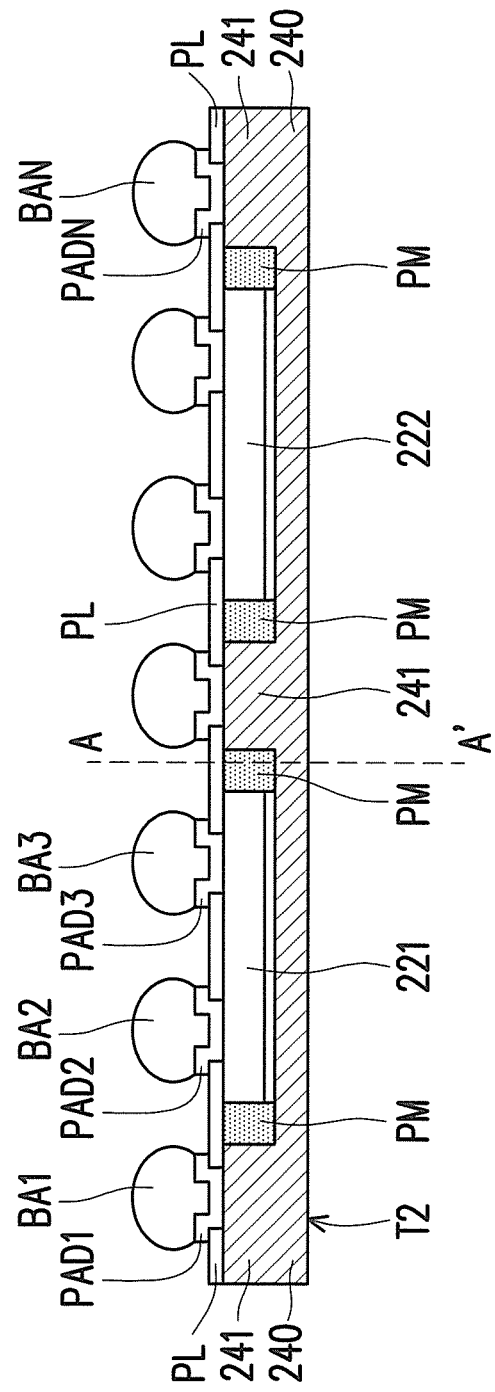

In view of FIG. 2J, it can be known that, the chips 221 to 222 are completed in a manner of wafer level chip scale package, and when tests are to be performed on the packaged chips 221 to 222, the tests may be completed by using a testing machine of wafer level chip scale package to test package bodies of wafer level chip scale package in FIG. 2J. Accordingly, a chip probing (CP) may be used to perform a one-time test in a probing manner on the die of the chip according to designed electric property standard specification, so as to significantly reduce testing costs and a time required by the tests. Naturally, a cutting process may first be performed before performing end product tests on the separated devices.

Figure 2K:
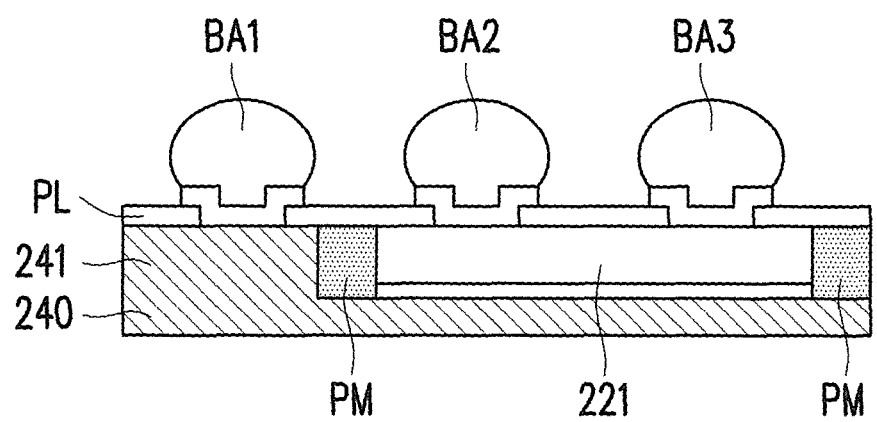

Lastly, the cutting process may be performed according to a line A-A' of FIG. 2J, so as to obtain the cut package structure as shown in FIG. 2K. In FIG. 2K, the first active surface of the chip 221 is electrically connected to the conductive cover plate 240 to form the drain of the transistor in the chip 221 through the solder ball BA1, and the second active surface of the chip 221 is electrically connected to the solder balls BA2 and BA3 to form respectively the gate and the source of the transistor in the chip 221.

Figure 3A:
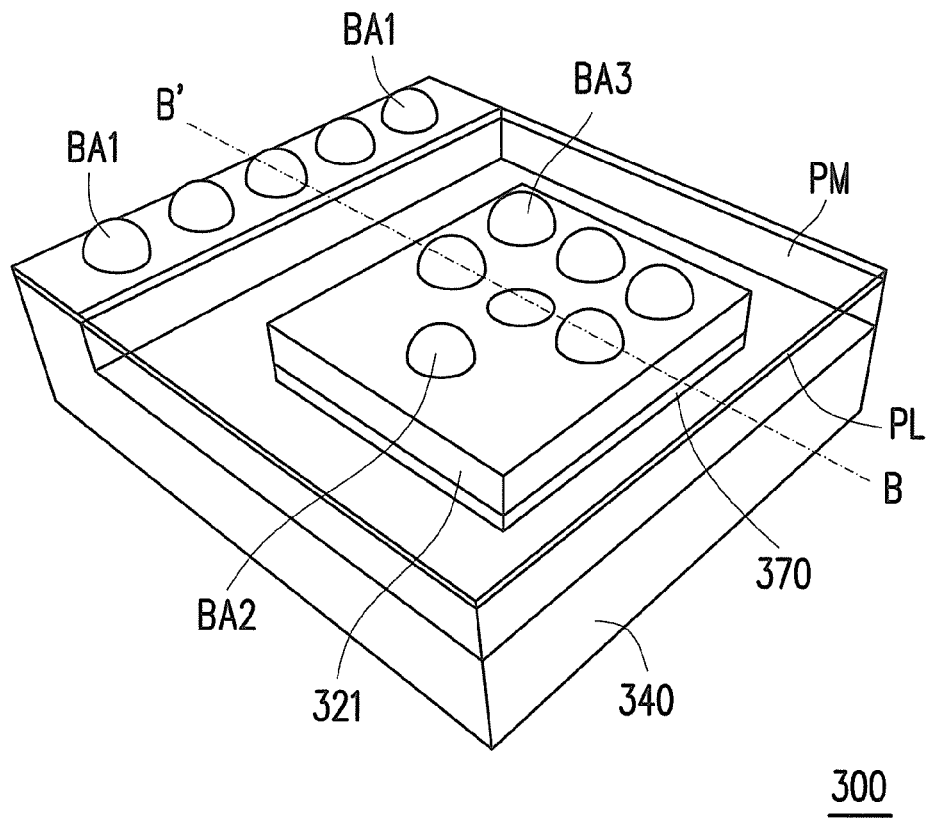
FIG. 3A is a 3D diagram illustrating a package structure 300 of wafer level chip scale according to an embodiment of the invention.
Figure 3B:
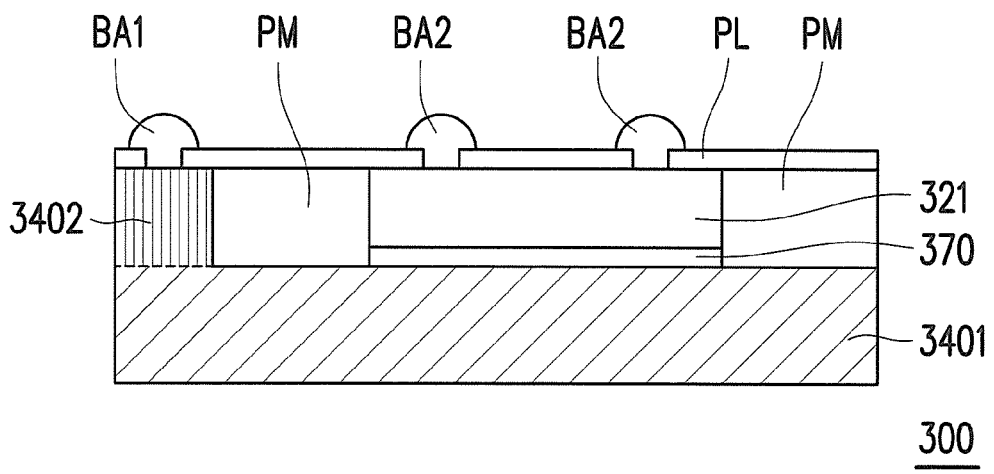
FIG. 3B is a cross-sectional diagram illustrating the package structure 300 taken along a line B-B'.

Hereinafter, referring to FIG. 3A and FIG. 3B together, FIG. 3A is a 3D diagram illustrating a package structure 300 of wafer level chip scale according to an embodiment of the invention, and FIG. 3B is a cross-sectional diagram illustrating the package structure 300 taken along a line B-B'. The package structure 300 is a package structure produced according to the packaging method in the embodiment of FIG. 1 of the invention. The package structure 300 includes a conductive plate 340 (one of those cut from the conductive cover plate 240), a chip 321, a first insulation structure PM, a second insulation structure PL and a plurality of solder balls BA1 to BA3. The conductive plate 340 includes a carrying portion 3401 and a protruding portion 3402 (corresponding to the partition plates 241 of FIG. 2H), and the carrying portion 3401 and the protruding portion 3402 are in contact with each other. The carrying portion 3401 is used to carry the chip 321, and the protruding portion 3402 is used to form the solder ball BA1.

The chip 321 is adhered on the carrying portion 3401 through an adhesive layer 370. The adhesive layer 370 may be an adhesive material made of conductive material, and the chip 321 is electrically connected to the conductive plate 340 through the adhesive layer 370. The first insulation structure PM surrounds a circumference of the chip 321 and covers on the carrying portion 3401 without contacting an upper surface of the chip 321. The second insulation structure PL isolates a plurality of electrode windows (referring to W1 to EN in FIG. 2H), and the second insulation structure PL covers on a part of the active surface of the chips 321 and a part of the protruding portion 3402 of the conductive plate 340. Because the electrode windows are not provided in the first insulation structure PM, the second insulation structure PL is capable of completely covering the first insulation structure PM. A plurality of electrode windows is in contact with the chip 321. A plurality of electrode windows is also provided on the protruding portion 3402. Afore-said electrode windows are used to form the solder balls BA1 to BA3, wherein the solder ball BA1 is disposed in the electrode windows on the protruding portion 3402, and the solder balls BA2 and BA3 are disposed in the electrode windows on the chip 321. In the present embodiment, the solder ball BA1 may serve as the drain of the transistor in the chip 321; the solder ball BA2 may serve as the gate of the transistor in the chip 321; and the solder ball BA3 may serve as the source of the transistor in the chip 321.

It should be noted that, the first insulation structure PM according to the embodiments of the invention is produced by injecting the liquid insulation material in the packaging space to which it will be produced and followed by performing the actions of curing on the liquid insulation material. An upper surface of the cured first insulation structure PM is coplanar with an upper surface of the protruding portion 3402 of the conductive plate 340 for forming the solder ball BA1. Accordingly, the cured first insulation structure PM may form a strong structure in the package structure 300 to effectively achieve the effectiveness of protecting the chip 321.

In correspondence to the foregoing embodiment regarding the packaging method, the protruding portion 3402 of the present embodiment refers to the partition plate on the conductive cover plate in the foregoing embodiment. The conductive plate 340 of the present embodiment refers to the conductive cover plate and a part of the conductive cover plate being cut. The first insulation structure PM is the insulation material in a cured condition.

Figure 3C:
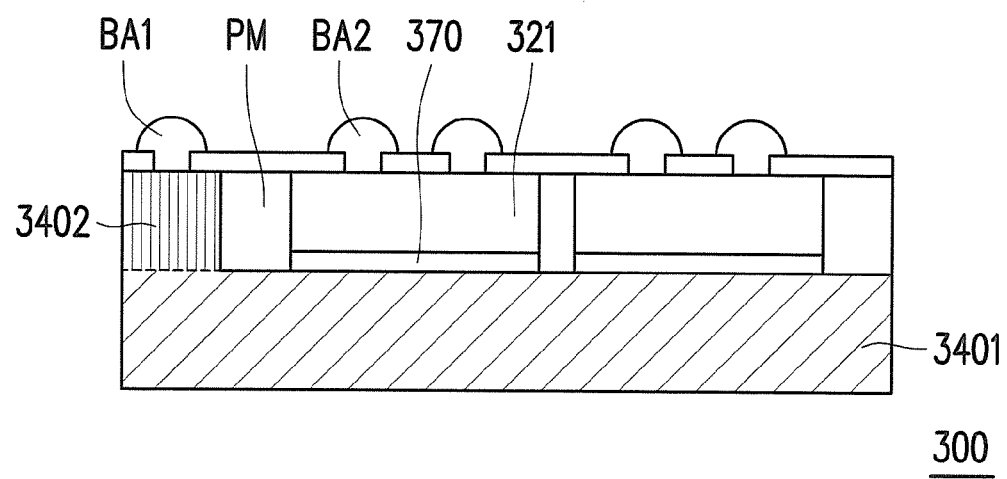
FIG. 3C is a cross-sectional diagram illustrating a package structure of wafer level chip scale according to another embodiment of the invention.

By using a metal connecting a metal layer of the drain of the chip as described in the present embodiment, a heat-dissipation effect may also be improved in addition to improve a mechanical strength thereof Moreover, the metal may also be connected to a printed circuit board (PCB) to further reduce thermal resistivity through a cooper of the PCB, so as to extend an operating life of the products. Furthermore, because the drain is connected to the metal, it is even more suitable in an application for thinner chips such as 50 μm or less. Therefore, as shown in FIG. 3C, two MOSFET with identical or different specifications may be placed in said application.

Figure 4A:
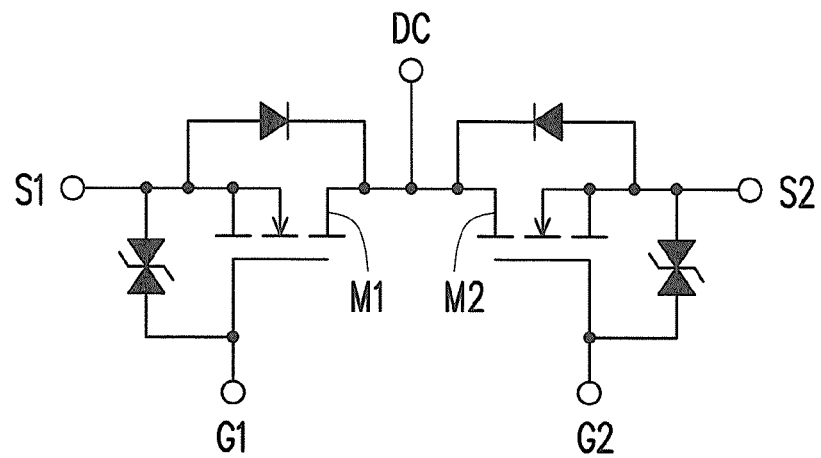
FIG. 4A to FIG. 4C are schematic diagrams illustrating applications of the package structure according to the embodiments of the invention.
Figure 4B:
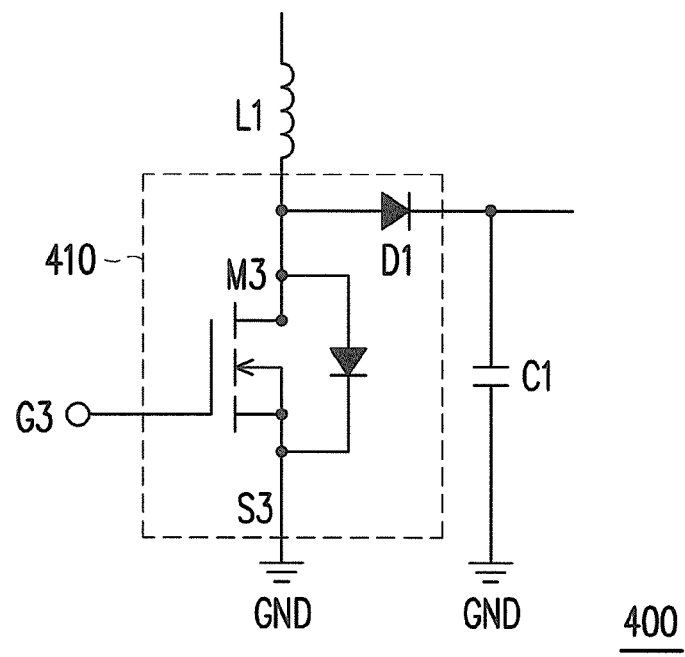
Figure 4C:
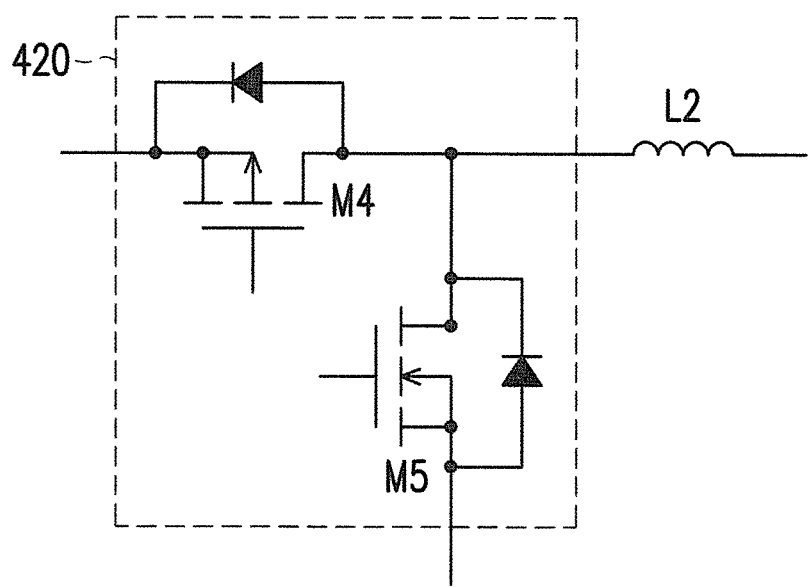

In regard to the chip 321, referring to FIG. 4A to FIG. 4C, which are schematic diagrams illustrating applications of the package structure according to the embodiments of the invention. In FIG. 4A, the chip 321 may include one or more transistors M1 and M2. Drains DC of the transistors Ml and M2 are connected to each other, and capable of forming an electrode through the solder ball BA1. Sources S1 and S2 of the transistors M1 and M2 may form two sources (which are isolated from each other) respectively through different solder balls BA3. Gates G1 and G2 of the transistors M1 and M2 may form two gates (which are isolated from each other) respectively through different solder balls BA1.

In FIG. 4B, the package structure of the invention may also be applied in a power conversion circuit. A power conversion circuit 400 in FIG. 4B includes a package structure 410. A chip in the package structure 410 includes a transistor M3 and a diode Dl. A drain of the transistor M3 and an anode of the diode Dl may be coupled to each other through the conductive plate in the package structure 410, and connected to an inductor L1 through an electrode formed by the corresponding solder ball. A source of the transistor M3 may be coupled to a ground terminal GND through an electrode formed by the corresponding solder ball. A gate of the transistor M3 may receive a driving voltage (e.g., a driving voltage for a pulse-width modulation signal) through an electrode formed by the corresponding solder ball. In addition, a cathode of the diode D1 may also be coupled to a capacitor C1 through an electrode formed by the corresponding solder ball.

FIG. 4C is a circuit including a package structure 420 having two transistors M4 to M5. In FIG. 4C, a drain commonly coupled to the transistors M4 to M5 may be connected to an inductor L2 through an electrode on the package structure 420, and gates and sources of the transistors M4 to M5 may receive required signals voltages respectively through the corresponding electrode, so as to satisfy requirements in circuit operations.

In summary, the insulation material covers the circumference of the chip by ways of suck-in or fill-in in the invention, so that the reliability of the packaged chip may be improved. Moreover, the packaging method of wafer level chip scale package is capable of reducing the complexity and the packaging costs in production process, so as to effectively improve competitiveness of the products.

What is claimed is:

1. A packaging method of wafer level chip scale package, comprising:
   providing a carrier;
   disposing a plurality of chips on the carrier;
   forming a plurality of adhesive layers on an active surface of the corresponding chips;
   covering a conductive cover plate, bonding the conductive cover plate with the chips through the adhesive layers, and dividing out a plurality of packaging spaces by the conductive cover plate for disposing the chips respectively;
   providing an insulation material to fill the packaging spaces through a plurality of via holes on the conductive cover plate to form a first insulation structure; and
   removing the carrier.

2. The packaging method of claim 1, wherein a first side of the conductive cover plate comprises a plurality of partition plates for dividing out the packaging spaces.

3. The packaging method of claim 2, wherein the after the step of removing the carrier, the method further comprises:
   providing a glass substrate at a second side of the conductive cover plate;
   forming a plurality of electrode windows to be respectively isolated by a second insulation structure; and
   forming a plurality of pads in the electrode windows to form a plurality of electrodes.

4. The packaging method of claim 3, wherein the second insulation structure covers on a part of the chips and a part of the partition plates.

5. The packaging method of claim 1, wherein the insulation material is a liquid substance, and the insulation material is provided to fill the packaging spaces to form the first insulation structure through the via holes.

6. The packaging method of claim 1, wherein the step of forming the adhesive layers on the active surface of the chips comprising:
   forming the adhesive layers on the active surface of the chips by dispensing or screen-coating, wherein the adhesive layers are conductive.

7. A package structure of wafer level chip scale package, comprising:
   a conductive plate, having a carrying portion and at least one protruding portion;
   a chip, adhered on the carrying portion through an adhesive layer;
   a first insulation structure surrounding a circumference of the chip on the carrying portion;
   a second insulation structure covering on a part of the chip and a part of the protruding portion, so as to isolate a plurality of electrode windows, respectively; and
   a plurality of pads, respectively disposed in the electrode windows to form a plurality of electrodes.

8. The package structure of wafer level chip scale package of claim 7, wherein a surface of the first insulation structure and a surface of the protruding portion are coplanar.

9. The package structure of wafer level chip scale package of claim 7, wherein the adhesive layers are conductive, and the chips comprises at least a metal-oxide-semiconductor field-effect transistor (MOSFET), an insulated gate bipolar transistor (IGBT), a bipolar junction transistor (BJT), a diode device and any combinations thereof.

* * * * *